United States Patent [19]

Okino

[11] Patent Number: 5,140,176

[45] Date of Patent: Aug. 18, 1992

[54] SEQUENTIAL LOGIC CIRCUIT DEVICE

[75] Inventor: Noboru Okino, Gyoda, Japan

[73] Assignee: Advantest Corporation, Tokyo, Japan

[21] Appl. No.: 666,001

[22] Filed: Mar. 7, 1991

[30] Foreign Application Priority Data

Mar. 9, 1990 [JP] Japan .................... 59646/90

[51] Int. Cl.⁵ .................... H03K 3/284; H03K 3/29
[52] U.S. Cl. .................... 307/272.2; 307/291
[58] Field of Search ............ 307/272.1, 272.2, 272.3, 307/291

[56] References Cited

U.S. PATENT DOCUMENTS

| | | | |
|---|---|---|---|
| 4,424,581 | 1/1984 | Kawai | 307/272.2 |
| 4,540,903 | 9/1985 | Cooke et al. | 307/272.2 |
| 4,580,066 | 4/1986 | Berndt | 307/291 |
| 4,970,417 | 11/1990 | Kubota | 307/272.3 |
| 5,003,204 | 3/1991 | Cushing et al. | 307/272.2 |

Primary Examiner—Edward P. Westin
Assistant Examiner—Richard Roseen
Attorney, Agent, or Firm—Staas & Halsey

[57] ABSTRACT

A logic circuit part, which is composed of a flip-flop group and a combinational circuit and performs a sequential logic operation, is added with a specify circuit for selectively specifying desired flip-flop circuits in the flip-flop group and a write circuit for applying a set or reset signal to the flip-flop circuits selectively specified by the specify circuit. Each flip-flop circuit includes: a flip-flop for writing input data in response to a system clock; a first AND gate which, when the flip-flop circuit is selectively specified by the specify circuit, passes therethrough the set signal to set the flip-flop; a second AND gate which, when the flip-flop circuit is selectively specified by the specify circuit, passes therethrough the reset signal to reset the flip-flop; and a third and gate which, when the flip-flop circuit is selectively specified by the specify circuit, passes therethrough the output logic of the flip-flop to the outside.

3 Claims, 4 Drawing Sheets

SEQUENTIAL LOGIC CIRCUIT DEVICE

BACKGROUND OF THE INVENTION

The present invention relates to a sequential logic circuit device which is used in, for example, a computer BIOS controller.

Logic circuits can be classified into a sequential logic circuit which includes flip-flops or similar storage circuits, and a combinational circuit of logic elements (such as an AND, an OR and an INV) which does not include the above-mentioned storage circuits. The sequential logic circuit is composed of pluralities of flip-flops and logic elements intermingled and interconnected as desired but it can be regarded as being made up of a flip-flop group and a logic element combinational circuit connected thereto.

The internal storage state of the sequential logic circuit (such as a shift register) usually varies with each operation clock, even if input data remains intact. In addition, the number of internal storage states increases with enlargement of the circuit scale. On this account, the generation of a test pattern of a high fault detection ratio for circuit testing use is far more difficult than in the case of testing combinational circuits.

A scan design system has been proposed as a solution to this problem (Ando, H., "Testing VLSI with Random Access Scan," Compcon, Spring 80, Digest of Papers, pp. 50-52, Feb. 1980, for example). According to this conventional system, a problem for testing the sequential operation type logic circuit can be solved as a problem for testing the combinational circuit by additionally providing a scan circuit for setting and observing directly from the outside the internal state of the flip-flop group capable of storing a number of logical operation states. By fabricating, for example, as one IC, sequential logic circuit devices each provided with the scan circuit which permits testing of the sequential logic circuit having primarily intended functions, each circuit device can easily be tested.

FIG. 1 shows an example of the sequential logic circuit in which a logic circuit part 10 having an intended function is added with a scan circuit 20 for testing use, based on the conventional scan design system. This example is cited from the above-mentioned literature. The logic circuit part 10 is shown to be divided into a combinational circuit 12 and a flip-flop group 11 composed of a plurality of flip-flops FC for the sake of convenience. The scan circuit 20 is made up of a write circuit 21 and a specify circuit 22. Based on decoded addresses X and Y obtained by decoding a scan address (AxAy) with an X decoder 21x and a Y decoder 21y, the specify circuit 22 selectively specifies one of flip-flop circuits FC in the flip-flop group 11.

For testing the logic circuit part 10 according to the scan design system, each flip-flop circuit FC has such a construction as shown in FIG. 2, for example. A system clock Csy and a clear signal CL can be provided in common to all of the flip-flop circuits FC. In each flip-flop circuit FC input data di from the combinational circuit 12 is loaded by the system clock Csy into a flip-flop FF via a gate G2 and its output data do is applied to the combinational circuit 12. This construction is to implement the intended function of the logic circuit part 10. In order that the logic circuit part 10 may be tested according to the scan design system, each flip-flop circuit FC includes gates G1 and G3, which are enabled by the decoded addresses X and Y which are provided from the specify circuit 22 for selecting the flip-flop circuit FC. A scan set signal Ss from the write circuit 21 is provided via the gate G1 of the selected flip-flop circuit FC to the flip-flop FF to set it. The output logic state of the flip-flop FF of the selected flip-flop circuit FC can be directly taken out of the logic circuit part 10, as a scan out signal Sout, via the gate G3. In the following description the output logic state of this flip-flop FF will also be referred to as the output logic state of the flip-flop circuit FC.

In the normal operation of the logic circuit part 10 as an ordinary logic circuit the scan circuit 20 is inoperative and the logic circuit part 10 performs the intended logical operation based on a system input data Din and the system clock Csy and provides system output data Dout.

The testing of the logic circuit part 10 starts with initializing the flip-flop FF of every flip-flop circuit FC in the flip-flop group 11 to a "0" by the clear signal CL as shown in FIG. 3. Next, a series of scan addresses (AxAy) for specifying flip-flops FF to be set to a "1" in the period $T_1$ are sequentially applied to the specify circuit 22 and, at the same time, a scan-in signal Sin and a scan clock Csc are applied to the write circuit 21, by which scan set signals Ss are sequentially provided to the flip-flop circuits FC specified by the scan addresses AxAy. Then, after predetermined flip-flop circuits FC have each been set to a predetermined logic state in the period $T_1$, predetermined system input data Din is applied to the logic circuit part 10 and, at the same time, one system clock Csy is provided, by which a transition is made in the internal state of the logic circuit part 10. For checking whether or not the internal state after the transition is an expected logic state, a series of scan addresses (AxAy) for specifying the flip-flops FF are sequentially applied to the specify circuit 22 in period $T_2$ and output logic states of the specified flip-flops FF are sequentially read out as scan-out signals Sout. At this time, the system output data Dout after the state transition is also obtained. Thereafter, the clear signal CL is applied again to all the flip-flop circuits FC to initialize them and then the application of the scan set signal Ss to the flip-flop circuits FC, the transition of the internal state of the logic circuit part 10 by the system clock Csy and the readout of the scan-out signal Sout are repeated in the same manner as described above.

As will be seen from the above, the conventional circuit arrangement calls for inputting the clear signal CL prior to the setting by the scan circuit 20, and consequently, those of the flip-flops FF which have already been set and need not be reset will also be reset by the clear signal CL. Hence, the states of all the flip-flops FF in the flip-flop group 11 must be set again —this inevitably increases the time $T_1$ for setting the flip-flops FF.

SUMMARY OF THE INVENTION

It is therefore an object of the present invention to provide a sequential logic circuit device which permits quick setting of the states of flip-flops of the logic circuit part.

The sequential logic circuit device according to the present invention includes: a combinational circuit; a logic circuit part provided with a flip-flop group; a specify circuit for specifying each flip-flop in the flip-flop group directly from an external terminal; write means for arbitrarily writing a "0" or "1" into each flip-flop of the flip-flop group; and readout means for outputting the state of each flip-flop of the flip-flop group to an external terminal.

With the circuit structure of the present invention, a "0" or "1" can freely be written into each flip-flop of the flip-flop group, besides the state of the flip-flop can freely be read out. Hence, the logic state of each flip-flop in the flip-flop group can be detected from the outside and only those of the flip-flops whose logic states must be changed can be accessed from the outside for rewriting their logic states. This affords reduction of the time for initialization in the case of testing, and consequently, shortens the time for testing.

DESCRIPTION OF THE PREFERRED EMBODIMENT

Figure 1:
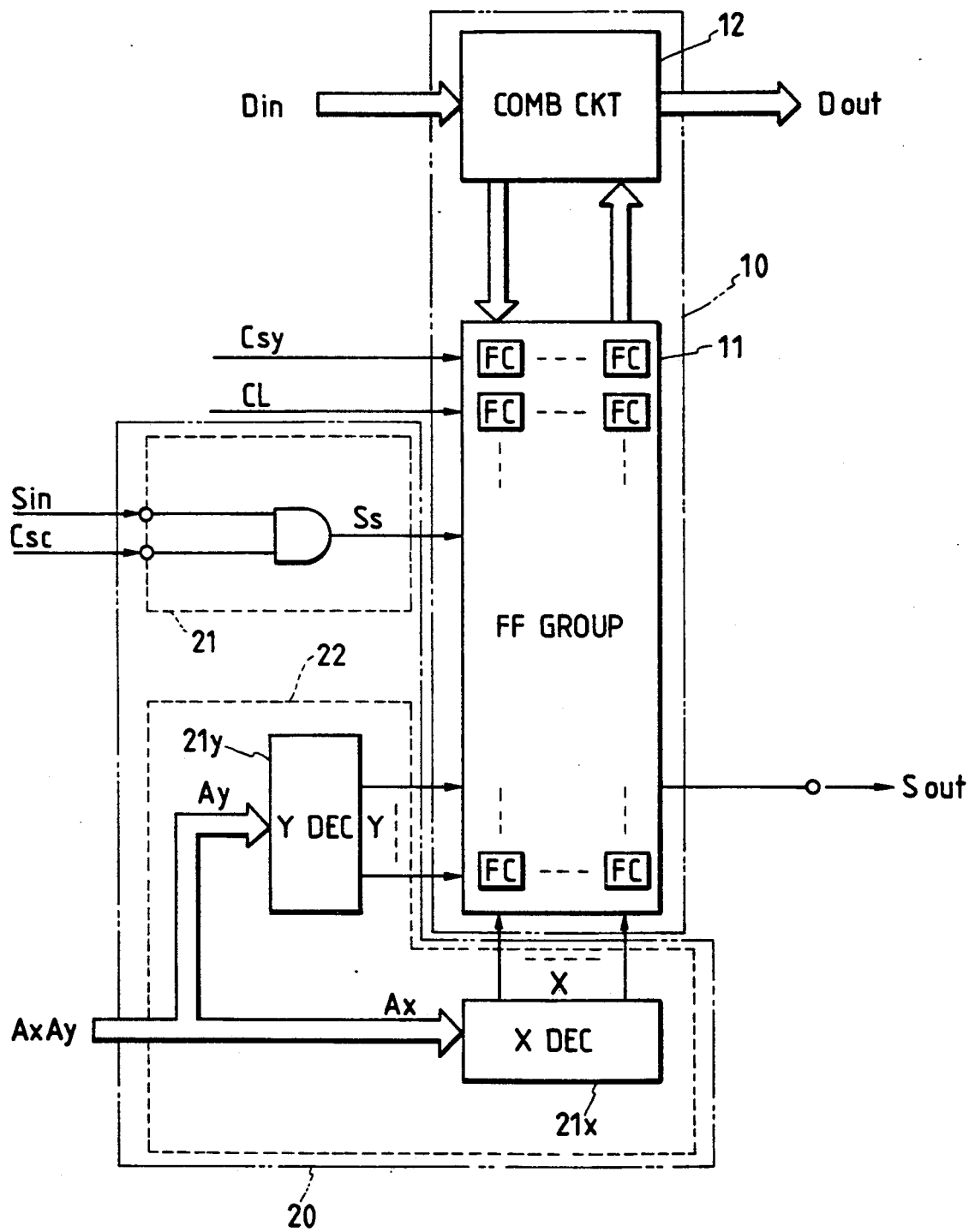
FIG. 1 is a block diagram for explaining a conventional sequential logic circuit device.
Figure 2:
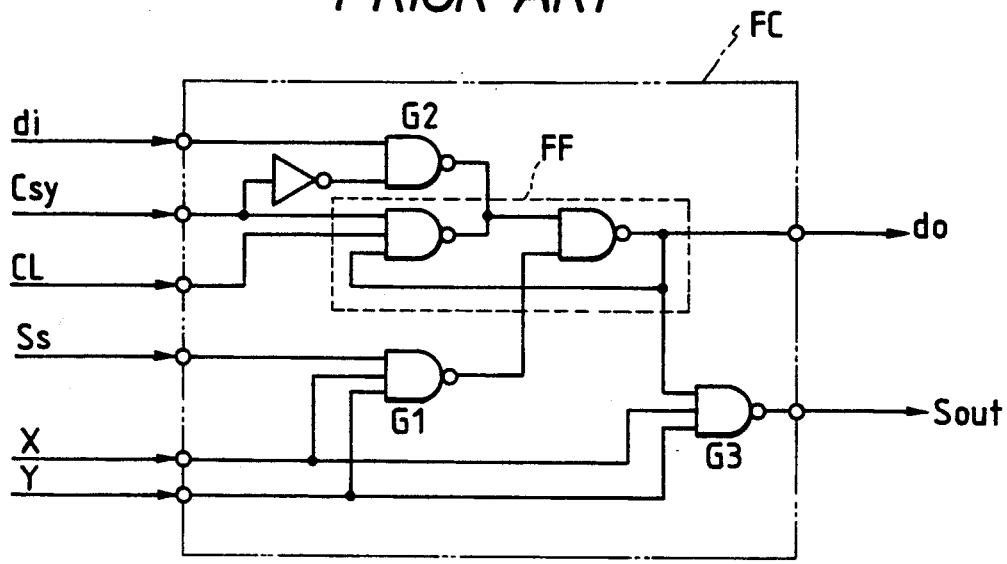
FIG. 2 is a connection diagram for explaining the concrete structure of a flip-flop circuit for use in the device depicted in FIG. 1.
Figure 4:
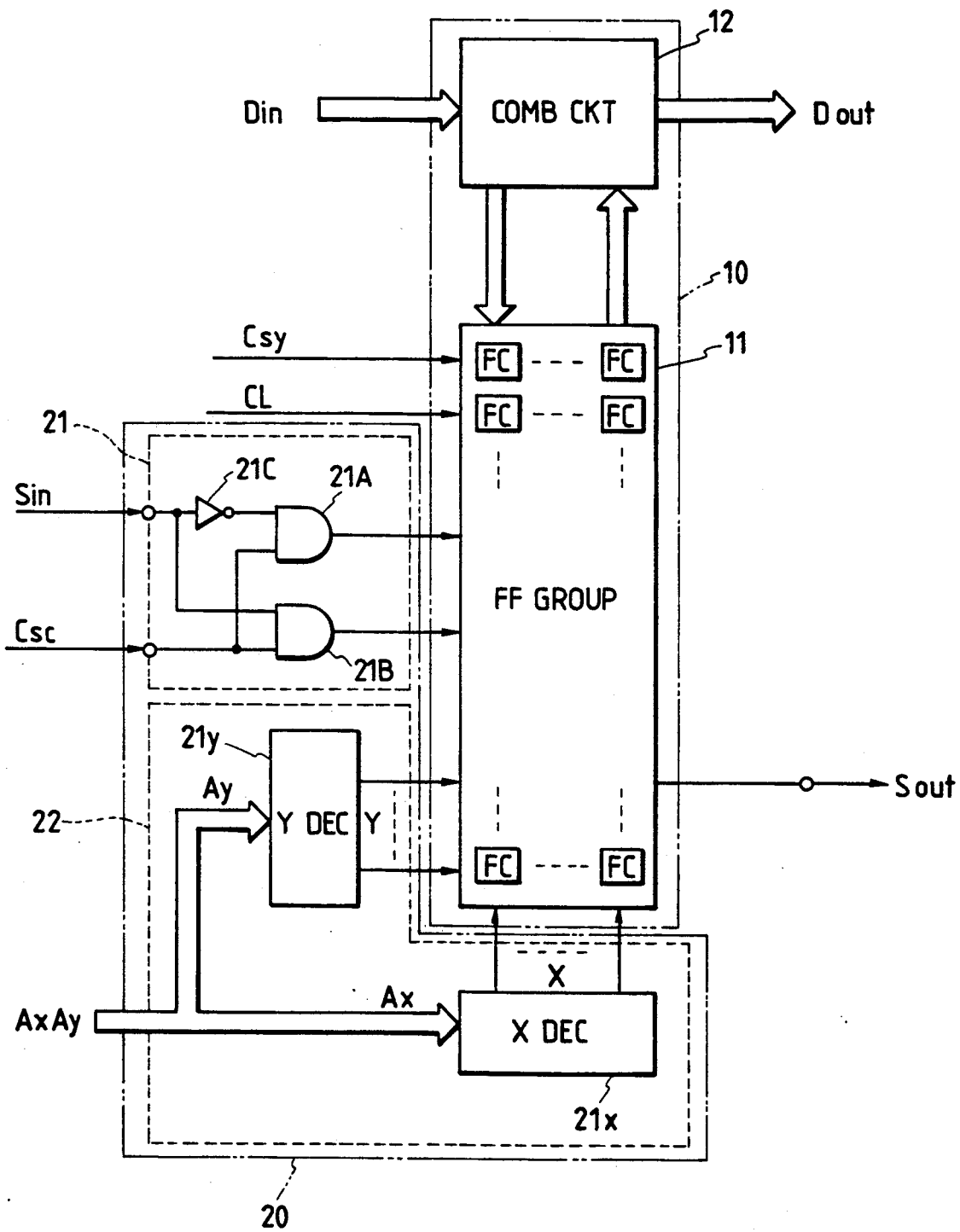
FIG. 4 is a block diagram illustrating an embodiment of the sequential logic circuit device of the present invention.

FIG. 4 illustrates the construction of the sequential logic circuit device according to the present invention. This embodiment is identical with the prior art example of FIG. 1 in the provision of the combinational circuit 12 and the flip-flop group 11 in the logic circuit part 10 and the scan circuit 20 but differs from the prior art in the constructions of each flip-flop circuit FC forming the flip-flop group 11 and the write circuit 21 forming the scan circuit 20 as described below.

In the present invention the write circuit 21 which forms the scan circuit 20 is constructed so that it can freely set a "0" or "1" in a desired one or ones of the flip-flops in the flip-flop group 11. In this embodiment the write circuit 21 is made up of two AND gates 21A and 21B and an inverter 21C and the scan-in signal Sin is applied to the one input terminal of the gate 21B and via the inverter 21C to the one input terminal of the gate 21A. The scan clock Csc is provided to the other input terminals of the gates 21A and 21B. When the scan-in signal Sin is a "1", the gate 21A is disabled, whereas the gate 21B is enabled. As a result of this, the scan clock Csc is provided, as the scan set signal Ss, via the gate 21B to all of the flip-flop circuits FC in the flip-flop group 11, and a "1" is written into that one of the flip-flop circuits FC which is being specified by the specify circuit 22 at this time.

When the scan-in signal Sin is switched to a "0", the gate 21B is disabled but instead the gate 21A is enabled. Consequently, in this instance the scan clock Csc is provided, as a scan reset signal Rs, via the gate 21A to all the flip-flop circuits FC in the flip-flop group 11, and a "0" is written into that one of the flip-flop circuits FC which is being specified by the specify circuit 22 at this time.

Figure 5:
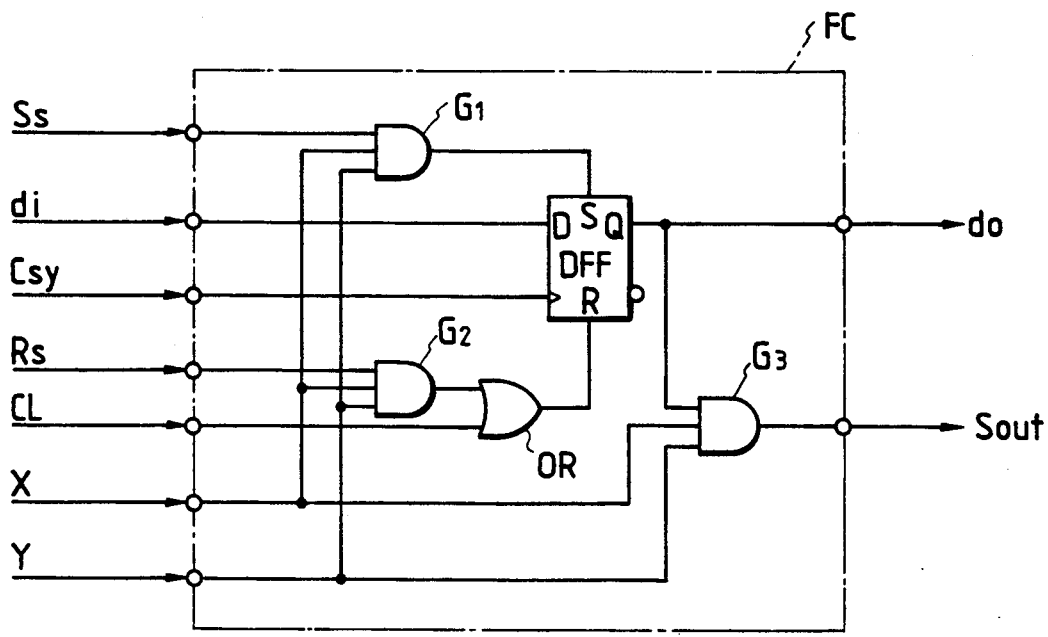
FIG. 5 is a connection diagram showing an example of the concrete structure of the flip-flop circuit for use in the embodiment of FIG. 4.

FIG. 5 illustrates the construction of each flip-flop circuit FC which is provided in the flip-flop group 11.

The flip-flop circuit FC is shown to be composed of a D type flip-flop DFF provided with a set input terminal S and a reset input terminal R, three AND gates G1, G2 and G3 which are enabled when the decoded addresses X and Y both match a "1", that is, when the flip-flop circuit FC is specified by the specify circuit 2, and one OR gate OR.

The gate G1 is enabled when the decoded addresses X and Y both go to a "1", and if the scan set signal Ss mentioned above in respect of FIG. 4 is input at this time, it is provided to the set input terminal S of the D type flip-flop DFF, by which the flip-flop DFF is set and a "1" is written thereinto.

On the other hand, if the scan reset signal Rs is input into the gate G2 when the decoded addresses X and Y are both at the "1" level, the scan reset signal Rs is applied to the reset terminal R of the D type flip-flop DFF via the gate G2 and the OR gate OR, by which the D type flip-flop DFF is reset and a "0" is written thereinto. Incidentally, whether the scan set signal Ss or the scan reset signal Rs is input as mentioned above is dependent on whether the scan-in signal Sin which is provided to the write circuit 21 is a "1" or "0".

When the gate G3 is enabled, the output logic state (a Q output) of the D type flip-flop DFF is directly output, as the scan-out signal Sout, to the outside of the logic circuit part 10. Since the gates G1 and G2 are also enabled together with the gate G3, the result of the write (set or reset) in the D flip-flop DFF can be read out at the same time as the write is effected in the flip-flop DFF, and the logic state of a desired one of the flip-flops can also be read out.

Figure 3:
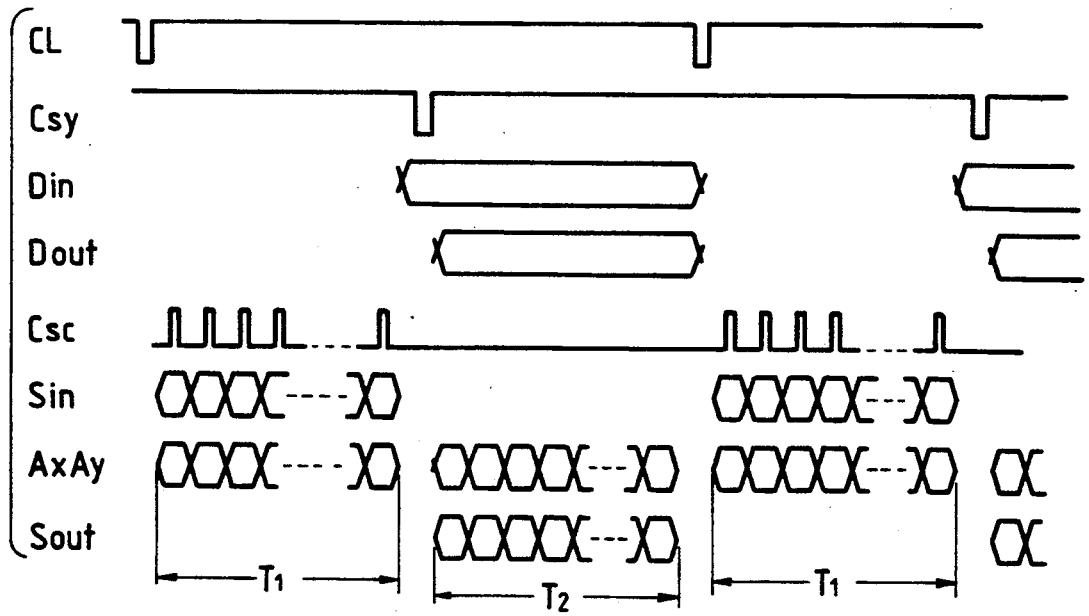
FIG. 3 is timing chart for explaining the operation of the device shown in FIG. 1.
Figure 6:
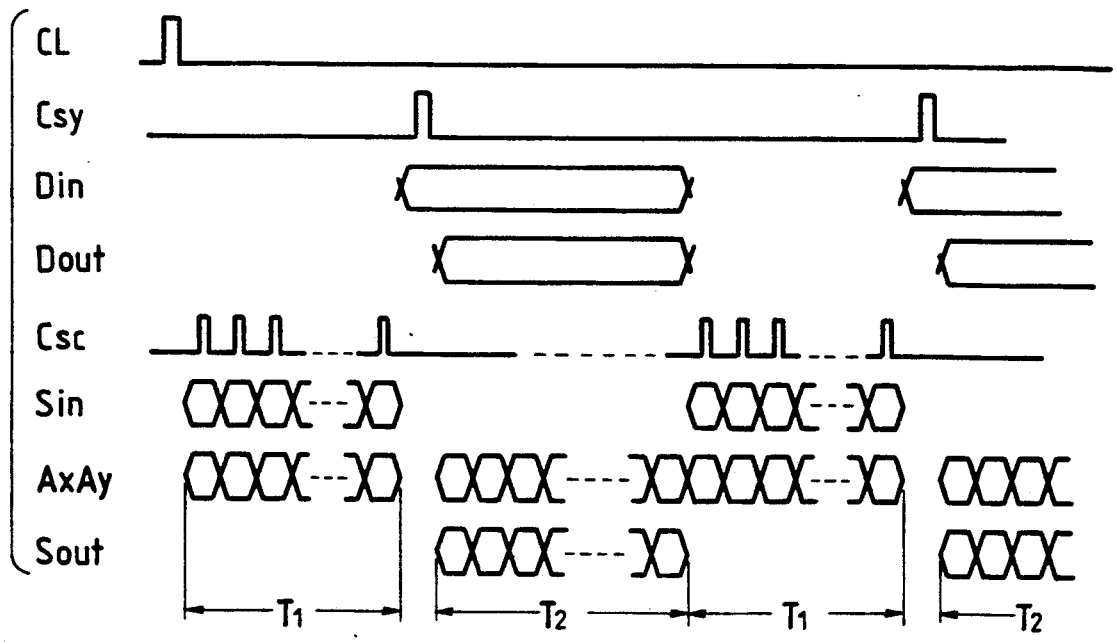
FIG. 6 is a timing chart for explaining the operation of the device illustrated in FIG. 4.

For testing the logic circuit part 10 of the device of the present invention shown in FIG. 4, the first step is to initialize the flip-flops DFF of all the flip-flop circuits FC in the flip-flop group 11 to the "0" level by the clear signal CL as shown in FIG. 6. Next, a sequence of scan addresses (AxAy) for specifying the flip-flops DFF in which a "1" is to be set in the period $T_1$ are sequentially applied to the specify circuit 22 from the outside, and at the same time, the scan-in signal Sin and the scan clock Csc are provided to the write circuit 21, by which the scan set signal Ss or scan reset signal Rs is applied to the flip-flop circuit FC specified by the scan address (AxAy). (In the first state setting period, i.e. in the scan write period $T_1$, however, since all the flip-flops DFF have been initialized to the "0" state by the clear signal CL, a "1" needs only to be written into a desired one of the flip-flops DFF and only the scan set signal Ss needs to be generated.) Next, predetermined system input data Din is provided to the logic circuit part 10, and at the same time, one shot of the system clock Csy is applied to the logic circuit part 10 to cause a transition of its internal state. To check whether or not the internal state after the transition is an expected logic state, a sequence of scan addresses AxAy for specifying the flip-flops DFF to be set to the "0" level are sequentially applied to the specify circuit 22 and the output logic states of the specified flip-flops DFF are sequentially read out as the scan out signal Sout. The procedure to this point is substantially the same as that adopted by the prior art example shown in FIG. 3. The device of the present invention makes a striking feature of the following procedure. That is, according to the construction of the device of the present invention, since either "1" or "0" can be written into a desired one of the flip-flop DFF, the second scan write needs to write a "1" or "0" into only those of the flip-flops DFF which differ in logic between the internal state of the logic circuit part 10 to be set and its current internal state. Therefore, the second scan write can immediately be effected without the necessity of applying the clear signal CL to the logic circuit part 10. Moreover, as the number of flip-flops DFF calling for the write decreases, the scan write period $T_1$ decreases accordingly. The same is true of the third and subsequent scan write periods $T_1$.

As described above, according to the present invention, the state of desired ones of the flip-flops in the flip flop group 11 can be read out and a "0" or "1" can selectively be written into the desired flip-flops.

Thus, even if all the flip-flops in the flip-flop group 11 are not reset by the clear signal CL prior to the initialization by the scan write as in the prior art, the write needs to be effected in only those of the flip-flops which are desired to change their logic state, accordingly the initialization can be accomplished in a short time. This affords reduction of the time for testing, and hence permits testing of a large number of logic circuit devices within a short time.

Further, when a design error is found in the trial manufacture of the logic circuit device, it is possible to easily continue confirmation of its operation by re-setting flip-flops which are not in a predetermined state to a correct state through the specify circuit 22 and the write circuit 21.

What is claimed is:

1. A sequential logic circuit device comprising:
    a logic circuit part composed of a flip-flop group including a plurality of flip-flop circuits and a combinatorial circuit connected to said flip-flop group, for performing a predetermined sequential logic operation;
    specify circuit means for selectively specifying said flip-flop circuits in said flip-flop group in accordance with an external address, said specify circuit means including decoder means for decoding said address and applying a decoded address signal to each said flip-flop circuit selectively specified in said flip-flop group; and
    write circuit means whereby set or reset signals are applied to said flip-flop circuits selectively specified by said specify circuit means, in accordance with an external setting signal;
    wherein each of said flip-flop circuits in said flip-flop group includes;
    flip-flop means for storing logic input data;
    first gate means responsive to said decoded address signal to apply said set signal to said flip-flop means to set said flip-flop means;
    second gate means responsive to said decoded address signal and cleared by an external clear signal to apply said reset signal to said flip-flop means to reset said flip-flop means; and
    third gate means for externally outputting the logic in said flip-flop means in response to said decoded address signal.

2. The sequential logic circuit device of claim 1, wherein said first, second and third gate means are AND gates.

3. The sequential logic circuit device of claim 2, wherein said flip-flop means of said each flip-flop circuit is a D type flip-flop which stores said input data in response to an external system clock.

* * * * *